United States Patent
Lee et al.

(10) Patent No.: US 10,340,018 B2
(45) Date of Patent: Jul. 2, 2019

(54) MEMORY DEVICE FOR PERFORMING PROGRAM OPERATION AND OPERATING METHOD THEREOF

(71) Applicant: SK hynix Inc., Gyeonggi-do (KR)

(72) Inventors: Hee Youl Lee, Gyeonggi-do (KR); Sung Ho Bae, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/818,896

(22) Filed: Nov. 21, 2017

(65) Prior Publication Data

US 2019/0057751 A1 Feb. 21, 2019

(30) Foreign Application Priority Data

Aug. 17, 2017 (KR) .......................... 10-2017-0104295

(51) Int. Cl.
| | |
|---|---|
| G11C 16/06 | (2006.01) |
| G11C 16/34 | (2006.01) |
| G11C 16/04 | (2006.01) |
| G11C 16/08 | (2006.01) |
| G11C 16/24 | (2006.01) |
| G11C 16/12 | (2006.01) |

(52) U.S. Cl.
CPC .......... *G11C 16/3459* (2013.01); *G11C 16/04* (2013.01); *G11C 16/08* (2013.01); *G11C 16/12* (2013.01); *G11C 16/24* (2013.01)

(58) Field of Classification Search
CPC .................................................. G11C 16/3459
USPC ....................................................... 365/185.22
See application file for complete search history.

(56) References Cited

U.S. PATENT DOCUMENTS

| | | | |
|---|---|---|---|
| 2016/0103763 A1* | 4/2016 | Chen ..................... | G11C 16/10 |
| | | | 711/154 |
| 2016/0358664 A1* | 12/2016 | Li ....................... | G11C 16/3459 |

FOREIGN PATENT DOCUMENTS

| | | |
|---|---|---|
| KR | 1020130132075 | 12/2013 |
| KR | 1020160025076 | 3/2016 |

* cited by examiner

*Primary Examiner* — Hoai V Ho
(74) *Attorney, Agent, or Firm* — IP & T Group LLP

(57) ABSTRACT

A memory device having an improved program speed may include a memory cell array including a plurality of memory cells, each being programmed to one of a plurality of program states; a peripheral circuit configured to perform a program operation to one or more of the plurality of memory cells, the program operation including a program voltage applying operation and a verify operation; and a control logic configured to control the peripheral circuit to simultaneously perform the verify operation for at least two program states by applying bit line voltages having different voltage levels to bit lines coupled to the plurality of memory cells.

16 Claims, 14 Drawing Sheets

| WORD LINE VOLTAGE | TARGET PROGRAM STATE | BIT LINE VOLTAGE[V] |
|---|---|---|
| PV2 | PV1 | VBLnormal − ΔV |
|  | PV2 | VBLnormal |
| PV3 | PV1 | VBLnormal − 2ΔV |
|  | PV2 | VBLnormal − ΔV |
|  | PV3 | VBLnormal |
| PV4 | PV1 | VBLnormal − 3ΔV |
|  | PV2 | VBLnormal − 2ΔV |
|  | PV3 | VBLnormal − ΔV |
|  | PV4 | VBLnormal |

MEMORY DEVICE FOR PERFORMING PROGRAM OPERATION AND OPERATING METHOD THEREOF

CROSS-REFERENCE TO RELATED APPLICATION

The present application claims priority under 35 U.S.C. § 119(a) to Korean patent application number 10-2017-0104295, filed on Aug. 17, 2017, the entire disclosure of which is herein incorporated by reference in its entirety.

BACKGROUND

Field of Invention

Various embodiments of the invention relate generally to an electronic device and, more particularly, to a semiconductor memory device and an operating method thereof.

Description of Related Art

A semiconductor memory device is a memory device implemented by using by using semiconductor materials such as silicon (Si), germanium (Ge), gallium arsenide (GaAs), and indium phosphide (InP). Semiconductor memory devices are classified into volatile memory devices and non-volatile memory devices.

Examples of non-volatile memory devices may include Read Only Memory (ROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM).

SUMMARY

Various embodiments are directed to a memory device exhibiting an improved program speed and an operating method thereof.

According to an embodiment, a memory device may include a memory cell array including a plurality of memory cells, each being programmed to one of a plurality of program states; a peripheral circuit configured to perform a program operation to one or more of the plurality of memory cells, the program operation including a program voltage applying operation and a verify operation; and a control logic configured to control the peripheral circuit to simultaneously perform the verify operation for at least two program states by applying bit line voltages having different voltage levels to bit lines coupled to the plurality of memory cells.

According to an embodiment, a method of operating a memory device including a plurality of memory cells each programmed to have one of a plurality of program states divided on the basis of threshold voltages may include applying a program voltage to a word line coupled to the plurality of memory cells; and simultaneously verifying at least two program states by applying bit line voltages different from each other to bit lines coupled to the plurality of memory cells.

According to an embodiment, a memory device may include a memory cell array including a plurality of memory cells, a peripheral circuit configured to perform a program voltage applying operation and a program verify operation on selected memory cells coupled to a selected word line, among the plurality of memory cells; and a control logic configured to control the peripheral circuit to simultaneously perform the program verify operation of applying a verify voltage to the selected word line and applying bit line voltages determined based on a threshold voltage difference between target program states of the selected memory cells and a program state corresponding to the verify voltage to bit lines coupled to the selected memory cells.

These and other features and advantages of the present invention will become apparent to those skilled in the art of the invention from the following detailed description in reference with the accompanying drawings.

DETAILED DESCRIPTION

Figure 1:
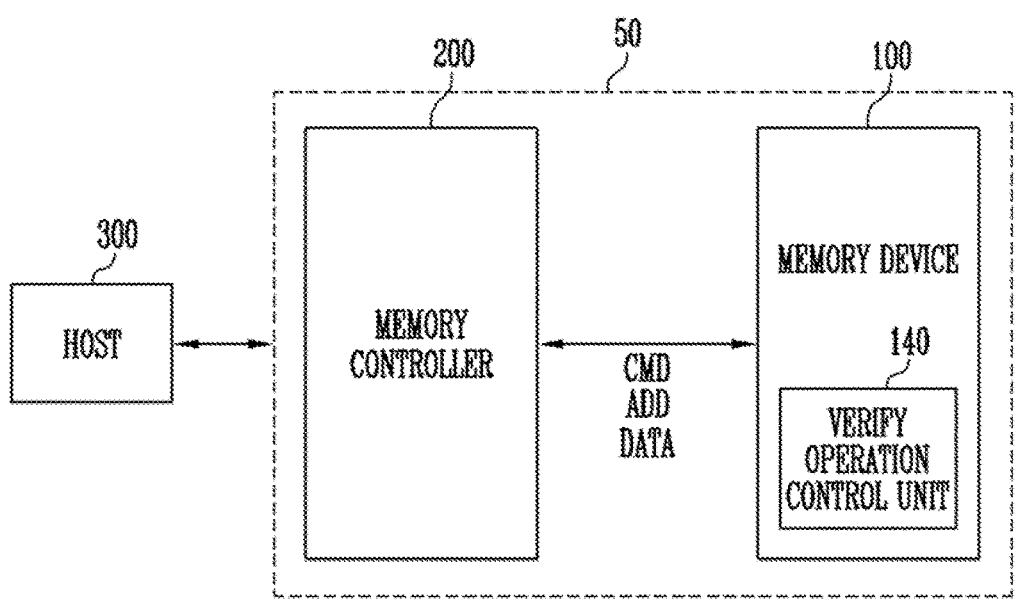
FIG. 1 is a diagram illustrating a storage device including a memory device according to an embodiment.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

In some embodiments, well-known processes, device structures, and technologies will not be described in detail to avoid ambiguousness of the present invention.

Hereinafter, the present disclosure will be described by explaining examples of embodiments with reference to the accompanying drawings.

FIG. 1 is a diagram illustrating a storage device 50 including a memory device 100 according to an embodiment.

Referring to FIG. 1, the storage device 50 may include the memory device 100 and a memory controller 200.

The memory device 100 may store data. The memory device 100 may operate in response to control of the memory controller 200. The memory device 100 may include a memory cell array including a plurality of memory cells storing data.

The memory cell array may include a plurality of memory blocks, each of which may include a plurality of memory cells. The memory device 100 may store data in the memory blocks in a sequential or random order in response to control the memory controller 200.

According to an embodiment, the memory device 100 may be a Double Data Rate Synchronous Dynamic Random Access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random Access Memory (RDRAM), a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

According to an embodiment, the memory device 100 may have a three-dimensional array structure. The present invention may be applicable to a charge trap flash (CTF) including a charge storage layer formed of an insulating layer as well as a flash memory device including a charge storage layer formed of a floating gate (FG).

The memory device 100 may receive a command CMD, an address ADD and data from the memory controller 200. The memory device 100 may perform an operation corresponding to the command CMD on an area selected by the address ADD received from the memory controller 200.

For example, the memory device 100 may perform a write operation (program operation), a read operation and an erase operation. During a program operation, the memory device 100 may program data into the area selected by the address ADD. During a read operation, the memory device 100 may read data from the selected area by the address ADD. During an erase operation, the memory device 100 may erase the data stored in the selected area by the address ADD.

According to an embodiment, the memory device 100 may further include a verify operation control unit 140.

A program operation of the memory device 100 may include a plurality of program loops. In other words, the memory device 100 may perform a plurality of program loops so that each of the memory cells may have one of a plurality of program states.

Each of the plurality of program loops may include a program voltage applying operation (PGM Step) in which a program voltage is applied and a verify operation (Verify Step) in which verify voltages are applied to determine whether the memory cells are programmed or not.

The verify operation control unit 140 may verify memory cells having different target program states at the same time during a verify operation included in a program loop. Detailed operations of the verify operation control unit 140 will be described below in more detail with reference to FIGS. 10 to 17.

The memory controller 200 may control the general operations of the memory device 100. For example, the memory controller 200 may control an operation of the memory device 100 in response a request received from the host 300. However, the memory controller 200 may control an operation of the memory device without receiving a request from the host 300. For example, the memory controller 200 may control the performance of one or more background operations of the memory device without receiving a request from the host 300.

For example, the memory controller 200 may control the memory device 100 to perform a program operation, a read operation or an erase operation at the request from the host 300. During the program operation, the memory controller 200 may provide a program command, a physical address, and data to the memory device 100. During the read operation, the memory controller 200 may provide a read command and a physical address to the memory device 100. During the erase operation, the memory controller 200 may provide an erase command and a physical address to the memory device 100.

According to an embodiment, the memory controller 200 may generate and transfer a program command, an address, and data to the memory device 100 without a request from the host 300. For example, the memory controller 200 may provide a command, an address, and data to the memory device 100 to perform background operations, such as a program operation for wear leveling and a program operation for garbage collection.

The memory controller 200 may execute firmware (FW) for controlling the memory device 100. When the memory device 100 is a flash memory device, the memory controller 200 may be configured to operate firmware such as a flash translation layer (FTL) for controlling communications between the host 300 and the memory device 100. More specifically, the memory controller 200 may translate a logical address included in the request from the host 300 into a physical address and supply the physical address ADD to the memory device 100.

The host 300 may communicate with the storage device 50 by using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM).

Figure 2:
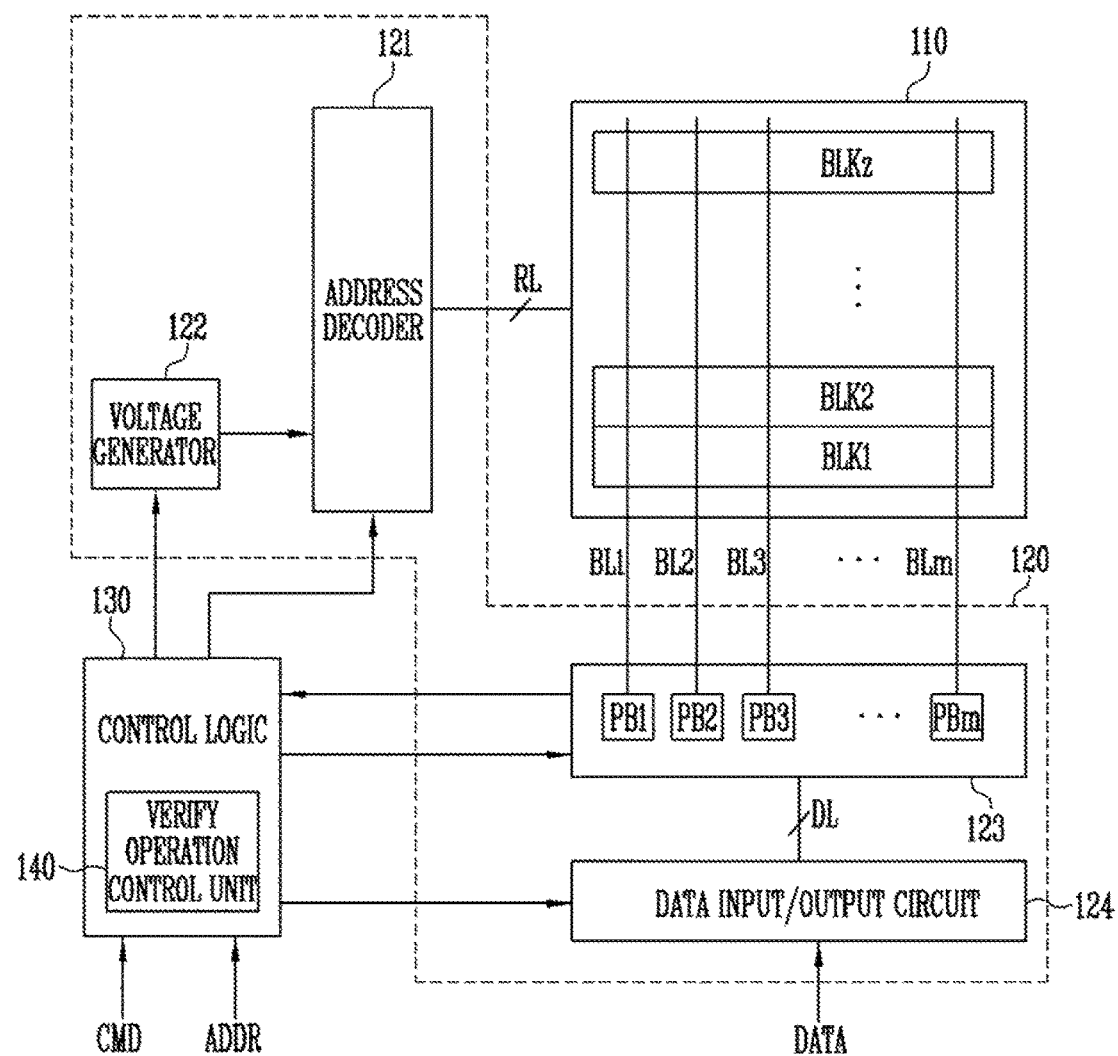
FIG. 2 is a diagram illustrating an exemplary structure of a memory device shown in FIG. 1.

FIG. 2 is a diagram illustrating an exemplary structure of the memory device 100 shown in FIG. 1.

Referring to FIG. 2, the memory device 100 may include the memory cell array 110, a peripheral circuit 120 and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a read and write circuit 123 through bit lines BL1 to BLm. Each of the memory blocks BLK1 to BLKz may include a plurality of memory cells. According to an embodiment, the plurality of memory cells may be non-volatile memory cells. Memory cells coupled to the same word line, among the plurality of memory cells, may be defined as a single page. In other words, the memory cell array 110 may include a plurality of pages. According to an embodiment, each of the memory blocks BLK1 to BLKz included in the memory cell array 110 may include a plurality of dummy cells. One or more of the dummy cells may be coupled in series between a drain selection transistor and memory cells and between a source selection transistor and the memory cells.

The memory cells of the memory device 100 may include a single level cell (SLC) storing a single data bit, a multi-level cell (MLC) storing two data bits, a triple level cell (TLC) storing three data bits, and a quad level cell (QLC) storing four data bits.

The peripheral circuit 120 may include the address decoder 121, a voltage generator 122, the read and write circuit 123 and a data input/output circuit 124.

The peripheral circuit 120 may drive the memory cell array 110. For example, the peripheral circuit 120 may drive the memory cell array 110 to perform a program operation, a read operation and an erase operation.

The address decoder 121 may be coupled to the memory cell array 110 through the row lines RL. The row lines RL may include drain selection lines, word lines, source selection lines and a common source line. According to an embodiment, the word lines may include normal word lines and dummy word lines. According to an embodiment, the row lines RL may further include a pipe selection line.

The address decoder 121 may be configured to operate in response to control of the control logic 130. The address decoder 121 may receive the address ADDR from the control logic 130.

The address decoder 121 may be configured to decode a block address of the received address ADDR. The address decoder 121 may select at least one memory block, among the memory blocks BLK1 to BLKz, according to the decoded block address. The address decoder 121 may be configured to decode a row address of the received address ADDR. The address decoder 121 may apply voltages provided from the voltage generator 122 to at least one word line of a selected memory block to at least one word line WL according to the decoded row address.

During a program operation, the address decoder 121 may apply a program voltage to a selected word line and a pass voltage having a lower voltage level than the program voltage to unselected word lines. During a program verify operation, the address decoder 121 may apply a verify voltage to the selected word line and a verify pass voltage greater than the verify voltage to unselected word lines.

During a read operation, the address decoder 121 may apply a read voltage to the selected word line and a greater read pass voltage than the read voltage to the unselected word lines.

According to an embodiment, an erase operation of the memory device 100 may be performed in units of memory blocks. During the erase operation, the address ADDR input to the memory device 100 may include a block address. The address decoder 121 may decode the block address and select one memory block according to the decoded block address. During the erase operation, the address decoder 121 may apply a ground voltage to word lines coupled to the selected memory block.

According to an embodiment, the address decoder 121 may be configured to decode a column address of the transferred address ADDR. A decoded column address DCA may be transferred to the read and write circuit 123. For example, the address decoder 121 may include components such as a row decoder, a column decoder and an address buffer.

The voltage generator 122 may be configured to generate a plurality of voltages by using an external power voltage supplied to the memory device 100. The voltage generator 122 may operate in response to control of the control logic 130.

According to an embodiment, the voltage generator 122 may generate an internal power voltage by regulating the external power voltage. The internal power voltage generated by the voltage generator 122 may be used as an operating voltage of the memory device 100.

According to an embodiment, the voltage generator 122 may generate a plurality of voltages by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage to generate a plurality of voltages having various voltage levels, and generate a plurality of voltages by selectively activating a plurality of pumping capacitors in response to control of the control logic 130.

The generated voltages may be supplied to the memory cell array 110 by the address decoder 121.

The read and write circuit 123 may include first to mth page buffers PB1 to PBm. Each of the first to mth page buffers PB1 to PBm may be coupled to the memory cell array 110 through each of the first to mth bit lines BL1 to BLm. The first to mth page buffers PB1 to PBm may operate in response to control of the control logic 130.

The first to mth page buffers PB1 to PBm may communicate data with the data input/output circuit 124. During a program, the first to mth page buffers PB1 to PBm may receive data DATA to be stored through the data input/output circuit 124 and data lines DL.

During a program operation, the first to mth page buffers PB1 to PBm may transfer the data DATA received through the data input/output circuit 124 to the selected memory cells through the bit lines BL1 to BLm when a program pulse is applied to the selected word line. Memory cells of a selected page may be programmed according to the transferred data DATA. More specifically, a memory cell coupled to a bit line to which a program permission voltage (e.g., a ground voltage) is applied may have an increased threshold voltage. A threshold voltage of a memory cell coupled to a bit line to which a program inhibition voltage (e.g., a power voltage) is applied may be maintained. During a program verify operation, the first to mth page buffers PB1 to PBm may read data stored in the selected memory cells through bit lines BL1 to BLm.

During a read operation, the read and write circuit 123 may read the data DATA from the memory cells of the selected page through the bit lines BL and output the read data DATA to the data input/output circuit 124.

During an erase operation, the read and write circuit 123 may float the bit lines BL. According to an embodiment, the read and write circuit 123 may include a column selection circuit.

The data input/output circuit 124 may be coupled to the first to mth page buffers PB1 to PBm trough the data lines DL. The data input/output circuit 124 may operate in response to control of the control logic 130.

The data input/output circuit 124 may include a plurality of input/output buffers (not illustrated) receiving data being input. During a program operation, the data input/output circuit 124 may receive the data DATA to be stored from an external controller (not illustrated). During a read operation, the data input/output circuit 124 may output the data transferred from the first to mth page buffers PB1 to PBm included in the read and write circuit 123 to the external controller.

The control logic 130 may be coupled to the address decoder 121, the voltage generator 122, the read and write circuit 123 and the data input/output circuit 124. The control logic 130 may be configured to control the general operations of the memory device 100. The control logic 130 may operate in response to the command CMD. According to an embodiment, the address ADDR received by the control logic 130 may be the same as the address ADD described with reference to FIG. 1.

According to an embodiment of the invention, the control logic 130 may further include the verify operation control unit 140.

A program operation of the memory device 100 may include a plurality of program loops. In other words, the memory device 100 may perform the plurality of program loops so that each of the memory cells may be programmed to have one of a plurality of program states.

Each of the plurality of program loops may include a program voltage applying operation (PGM Step) in which a program voltage is applied and a verify operation (Verify Step) in which verify voltages are applied to determine whether the memory cells are programmed or not.

The verify operation control unit 140 may verify memory cells having different target program states during the verify operation included in the program loop. More specifically, during the verify operation, the verify operation control unit 140 may control the peripheral circuit 120 to apply different voltages to bit lines coupled to the memory cells having the different target program states.

For example, the verify operation control unit 140 may determine a bit line voltage to be applied to the bit lines on the basis of target program states of memory cells and a program state corresponding to a verify voltage applied to a word line. The verify operation control unit 140 may control the peripheral circuit 120 to apply a reference bit line voltage to bit lines when the target program states of the memory cells coupled to the bit lines are the same as the program state corresponding to the verify voltage. Alternatively, the verify operation control unit 140 may control the peripheral circuit 120 to apply a lower voltage than the reference bit line voltage to the bit lines when threshold voltages corresponding to the target program states of the memory cells coupled to the bit lines are lower than a threshold voltage of the program state corresponding to the verify voltage.

Operations of the verify operation control unit 140 will be described below in more detail with reference to FIGS. 10 to 17.

Figure 3:
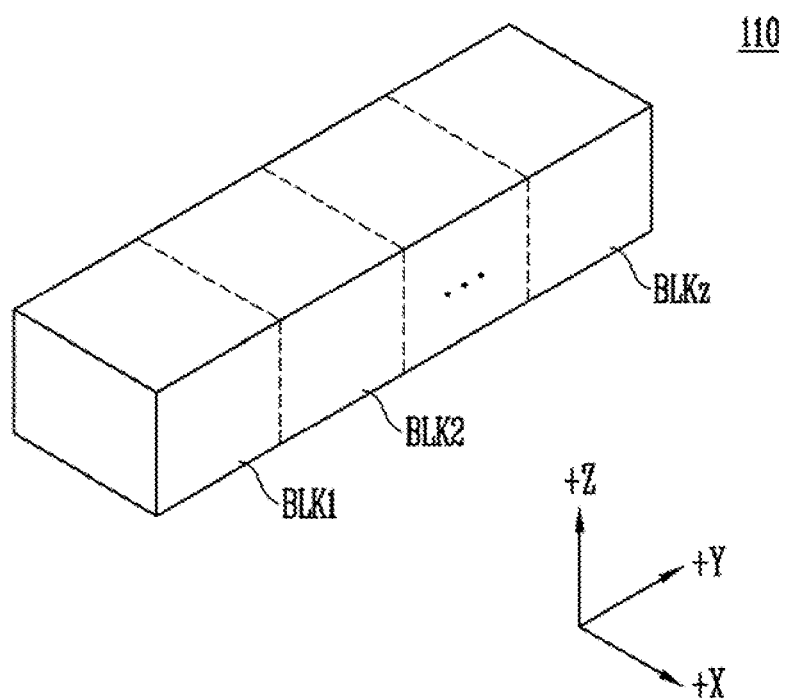
FIG. 3 is a diagram illustrating an embodiment of a memory cell array shown in FIG. 2.

FIG. 3 shows an embodiment of the memory cell array 110 shown in FIG. 2.

Referring to FIG. 3, the memory cell array 110 may include the memory blocks BLK1 to BLKz. Each of the memory blocks may have a three-dimensional structure. Each memory block may include a plurality of memory cells stacked over a substrate. The plurality of memory cells may be arranged in a +X direction, a +Y direction and a +Z direction. The structure of each memory block will be described in more detail with reference to FIGS. 4 and 5.

Figure 4:
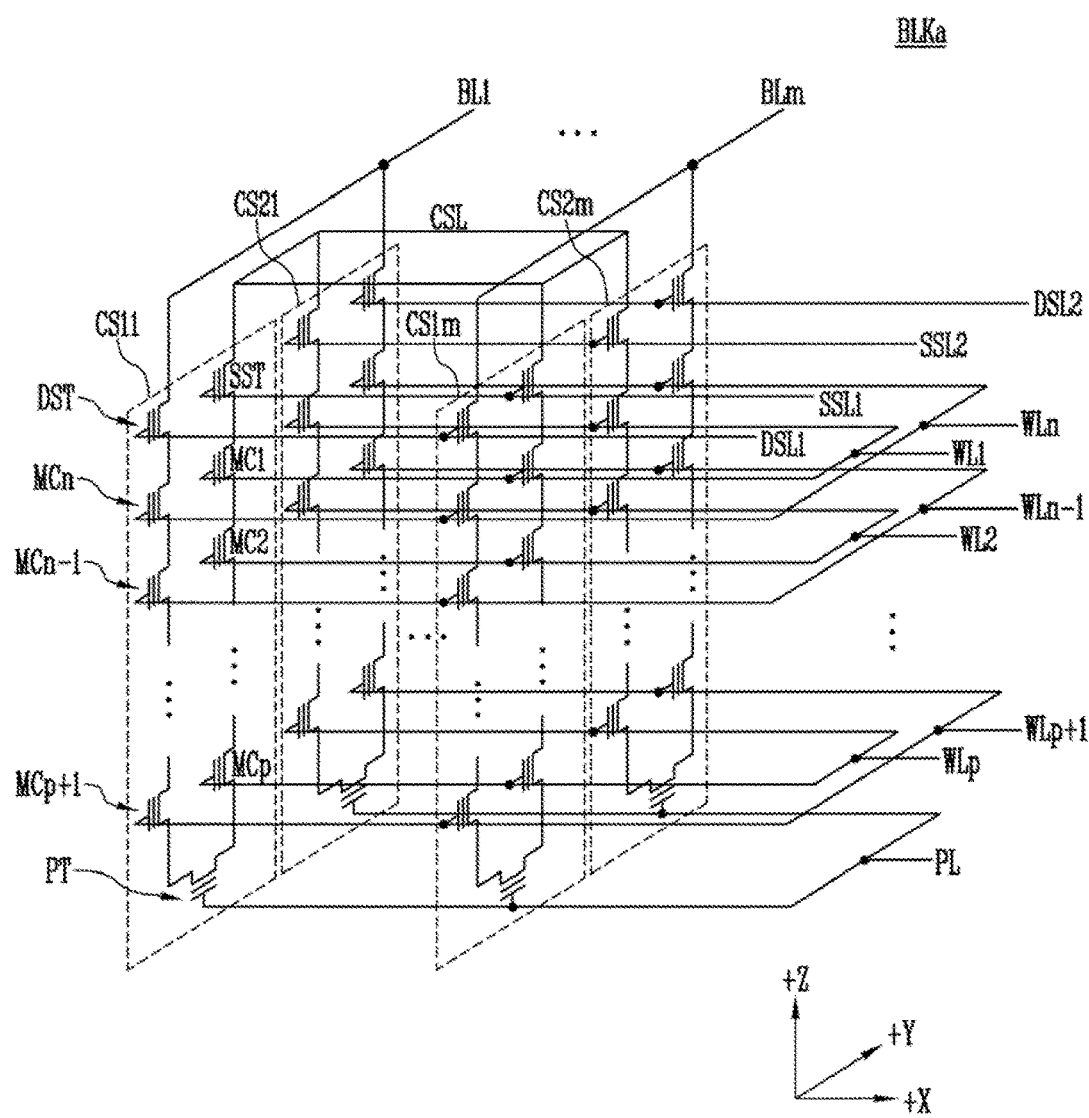
FIG. 4 is a circuit diagram illustrating one (BLKa) of memory blocks BLK to BLKz shown in FIG. 3.

FIG. 4 is a circuit diagram illustrating a memory block BLKa which is one of the memory blocks BLK1 to BLKz shown in FIG. 3.

Referring to FIG. 4, the memory block BLKa may include a plurality of cell strings CS11 to CS1m and CS21 to CS2m. According to an embodiment, each of the cell strings CS11 to CS1m and CS21 to CS2m may be formed into a 'U' shape. In the memory block BLKa, 'm' cell strings may be arranged in the row direction (i.e., +X direction). For convenience of explanation, as shown in FIG. 4, two cell strings may be arranged in a column direction (i.e., +Y direction). However, three or more cell strings may be arranged in the column direction.

Each of the cell strings CS11 to CS1$m$ and CS21 to CS2$m$ may include at least one source selection transistor SST, first to nth memory cells MC1 to MCn, a pipe transistor PT, and at least one drain selection transistor DST.

The selection transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer and a blocking insulating layer. According to an embodiment, a pillar for providing a channel layer may be provided to each cell string. According to an embodiment, a pillar for providing at least one of a channel layer, a tunneling insulating layer, a charge storage layer and a blocking insulating layer may be provided to each cell string.

The source selection transistor SST of each cell string may be coupled between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 4, source selection transistors of the cell strings CS11 to CS1$m$ in the first row may be coupled to a first source selection line SSL1. Source selection transistors of the cell strings CS21 to CS2$m$ in the second row may be coupled to a second source selection line SSL2.

According to another embodiment, source selection transistors of the cell strings CS11 to CS1$m$ and CS21 to CS2$m$ may be commonly coupled to a single source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be arranged in a sequential manner in a reverse direction to the +Z direction and coupled in series between the source selection transistor SST and the pipe transistor PT. The (p+1)th to nth memory cells MCp+1 to MCn may be sequentially arranged in the +Z direction and coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to n-th word lines WL1 to WLn, respectively.

A gate of the pipe transistor PT of each cell string may be coupled to a pipe line PL.

The drain selection transistor DST of each cell string may be coupled between a corresponding bit line and the memory cells MCp+1 to MCn. Cell strings arranged in a row direction may be coupled to a drain selection line extending in the row direction. Drain selection transistors of the cell strings CS11 to CS1$m$ in a first row may be coupled to a first drain selection line DSL1. Drain selection transistors of the cell strings CS21 to CS2$m$ in a second row may be coupled to a second drain selection line DSL2.

Cell strings arranged in a column direction may be coupled to a bit line extending in the column direction. In FIG. 3, the cell strings CS11 and CS21 in a first column may be coupled to the first bit line BL1. The cell strings CS1$m$ and CS2$m$ in an mth column may be coupled to the mth bit line BL$m$.

Memory cells coupled to the same word line in cell strings arranged in the row direction may form a single page. For example, memory cells coupled to the first word line WL1 in the cell strings CS11 to CS1$m$ in the first row may form a single page. Memory cells coupled to the first word line WL1 in the cell strings CS21 to CS2$m$ in the second row may form another page. When one of the drain selection lines DSL1 and DSL2 is selected, cell strings arranged in a row direction may be selected. When one of the word lines WL1 to WLn is selected, one page in selected cell strings may be selected.

According to another embodiment, even bit lines and odd bit lines may replace the first to mth bit lines BL1 to BL$m$. In addition, even cell strings of the cell strings CS11 to CS1$m$ or CS21 to CS2$m$ arranged in the row direction may be coupled to even bit lines, and odd cell strings of the cell strings CS11 to CS1$m$ or CS21 to CS2$m$ arranged in the row direction may be coupled to odd bit lines, respectively.

According to an embodiment, at least one of the first to nth memory cells MC1 to MCn may serve as a dummy memory cell. For example, at least one dummy memory cell may be provided to reduce electric fields between the source selection transistor SST and the memory cells MC1 to MCp. Alternatively, at least one dummy memory cell may be provided to reduce electric files between the drain selection transistor DST and the memory cells MCp+1 to MCn. When the number of dummy memory cells increases, operational reliability of the memory block BLKa may be increased. However, the size of the memory block BLKa may be increased. On the other hand, when the number of dummy memory cells decreases, the size of the memory block BLKa may be reduced, and operational reliability of the memory block BLKa may be reduced.

To efficiently control at least one dummy memory cell, each dummy memory cell may have a required threshold voltage. Before or after an erase operation on the memory block BLKa, program operations may be performed on a portion or entirety of the dummy memory cells. When an erase operation is performed after a program operation, dummy memory cells may have required threshold voltages by controlling a voltage applied to dummy word lines coupled to the dummy memory cells.

Figure 5:
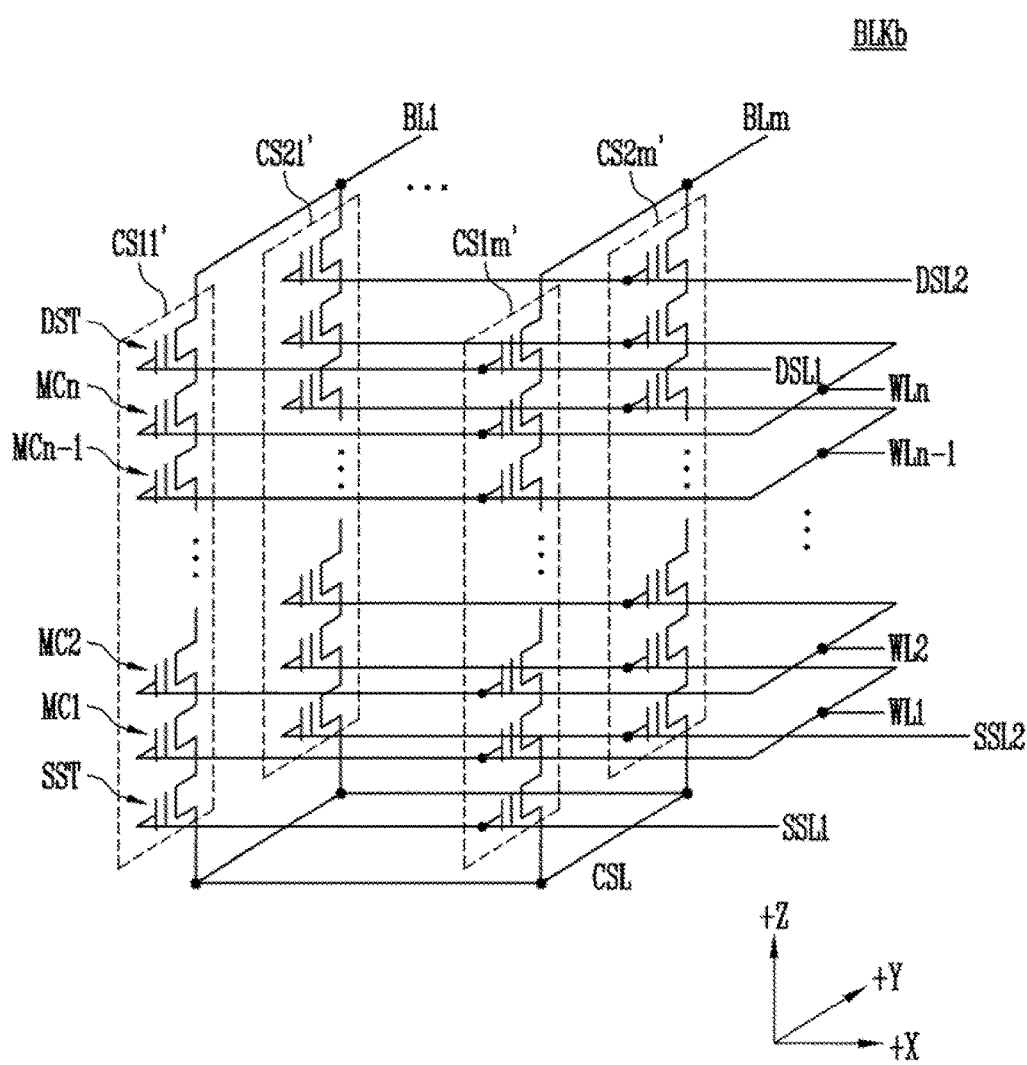
FIG. 5 is a circuit diagram illustrating another embodiment of one (BLKb) of memory blocks BLK1 to BLKz shown in FIG. 3.

FIG. 5 is a circuit diagram illustrating another embodiment of a memory block BLKb which is one of the memory blocks BLK1 to BLKz shown in FIG. 3.

Referring to FIG. 5, the memory block BLKb may include a plurality of cell strings CS11' to CS1$m$' and CS21' to CS2$m$'. The cell strings CS11' to CS1$m$' and CS21' to CS2$m$' may extend in +Z direction. Each of the cell strings CS11' to CS1$m$' and CS21' to CS2$m$' may include at least one source selection transistor SST, the first to nth memory cells MC1 to MCn and at least one drain selection transistor DST which are stacked over a substrate (not illustrated) under a memory block BLK1'.

The source selection transistor SST of each cell string may be coupled between the common source line CSL and the memory cells MC1 to MCn. Source selection transistors of cell strings arranged in the same row may be coupled to the same source selection line. Source selection transistors of the cell strings CS11' to CS1$m$' arranged in the first row may be coupled to the first source selection line SSL1. Source selection transistors of the cell strings CS21' to CS2$m$' arranged in the second row may be coupled to the second source selection line SSL2. According to another embodiment, source selection transistors of the cell strings CS11' to CS1m' and CS21' to CS2m' may be commonly coupled to a single source selection line.

The first to nth memory cells MC1 to MCn of each cell string may be coupled in series between the source selection transistor SST and the drain selection transistor DST. Gates of the first to nth memory cells MC1 to MCn may be coupled to the first to n-th word lines WL1 to WLn.

The drain selection transistor DST of each cell string may be coupled between a corresponding bit line and the memory cells MC1 to MCn. Drain selection transistors of cell strings arranged in a row direction may be coupled to a drain selection line extending in the row direction. Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

According to another embodiment, even bit lines and odd bit lines may replace the first to mth bit lines BL1 to BLm. Even cell strings of the cell strings CS11' to CS1m' or CS21' to CS2m' arranged in the row direction may be coupled to even bit lines, respectively, and odd cell strings of the cell strings CS11' to CS1m' or CS21' to CS2m' arranged in the row direction may be coupled to odd bit lines, respectively.

According to an embodiment, at least one of the first to nth memory cells MC1 to MCn may serve as a dummy memory cell. For example, at least one dummy memory cell may be provided to reduce electric fields between the source selection transistor SST and the memory cells MC1 to MCn. Alternatively, at least one dummy memory cell may be provided to reduce electric fields between the drain selection transistor DST and the memory cells MC1 to MCn. When more dummy memory cells are provided, operational reliability of the memory block BLKb may be improved. However, the size of the memory block BLKb may be increased. When fewer memory cells are provided, the size of the memory block BLKb and operational reliability of the memory block BLKb may be reduced.

To efficiently control at least one dummy memory cell, each of the dummy memory cells may have a required threshold voltage. Before or after an erase operation on the memory block BLKb, program operations may be performed on a portion or entirety of the dummy memory cells. When an erase operation is performed after a program operation is performed, dummy memory cells may have required threshold voltages by controlling a voltage applied to dummy word lines coupled to the dummy memory cells.

Figure 6:
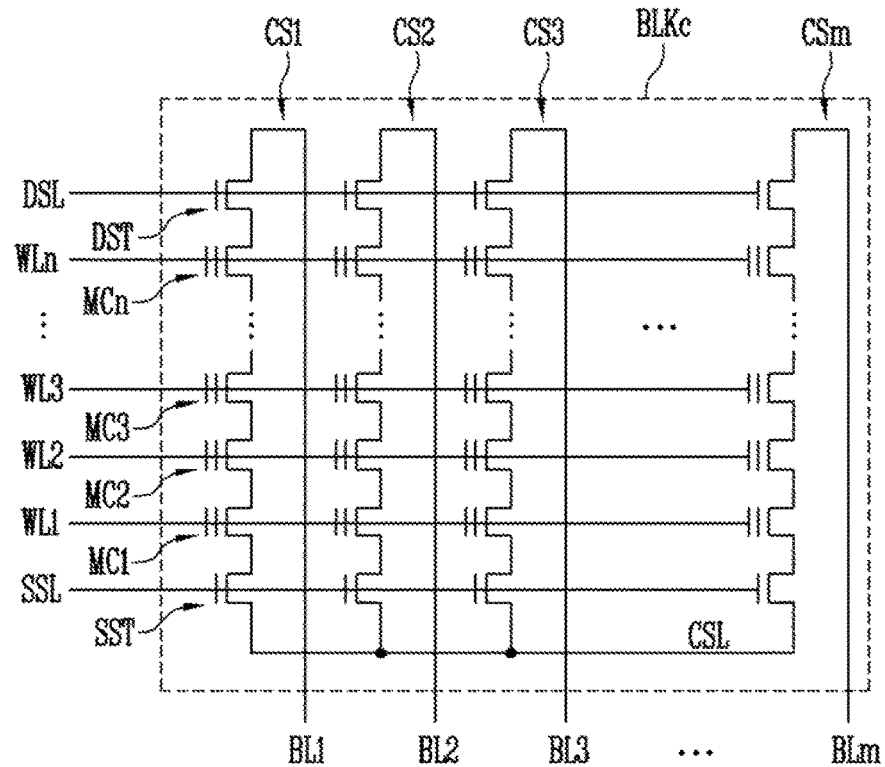
FIG. 6 is a circuit diagram illustrating an embodiment of one (BLKc) of memory blocks BLK1 to BLKz included in a memory cell array shown in FIG. 2.

FIG. 6 is a circuit diagram illustrating an embodiment of a memory block BLKc which is one of the memory blocks BLK1 to BLKz included in the memory cell array 110 shown in FIG. 2.

Referring to FIG. 6, the memory block BLKc may include a plurality of cell strings CS1 to CSm. The plurality of cell strings CS1 to CSm may be coupled to the plurality of bit lines BL1 to BLm, respectively. Each of the cell strings CS1 to CSm may include at least one source selection transistor SST, the first to nth memory cells MC1 to MCn, and at least one drain selection transistor DST.

The selection transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer and a blocking insulating layer. According to an embodiment, a pillar for providing a channel layer may be provided in each cell string. According to an embodiment, a pillar for providing one or more of the channel layer, the tunneling insulating layer, the charge storage layer and the blocking insulating layer may be provided in each cell string.

The source selection transistor SST of each cell string may be coupled between the common source line CSL and the memory cells MC1 to MCn.

The first to nth memory cells MC1 to MCn of each cell string may be coupled between the source selection transistor SST and the drain selection transistor DST.

The drain selection transistor DST of each cell string may be coupled between a corresponding bit line and the memory cells MC1 to MCn.

Memory cells coupled to the same word line may form a single page. When the drain selection line DSL is selected, the cell strings CS1 to CSm may be selected. When one of the word lines WL1 to WLn is selected, one page may be selected from selected cell strings.

According to another embodiment, even bit lines and odd bit lines may be provided from the first to mth bit lines BL1 to BLm. Even cell strings of the cell strings CS1 to CSm may be coupled to the even bit lines, respectively, and odd cell strings thereof may be coupled to the odd bit lines, respectively.

Figure 7:
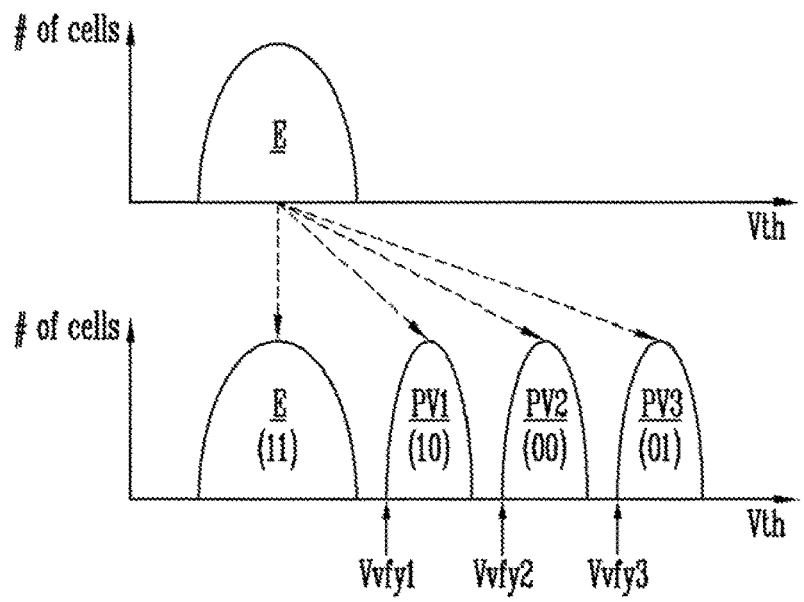
FIG. 7 is a diagram illustrating a threshold voltage distribution of memory cells formed by a program operation.

FIG. 7 is a diagram illustrating a threshold voltage distribution of memory cells formed by a program operation.

Figure 8:
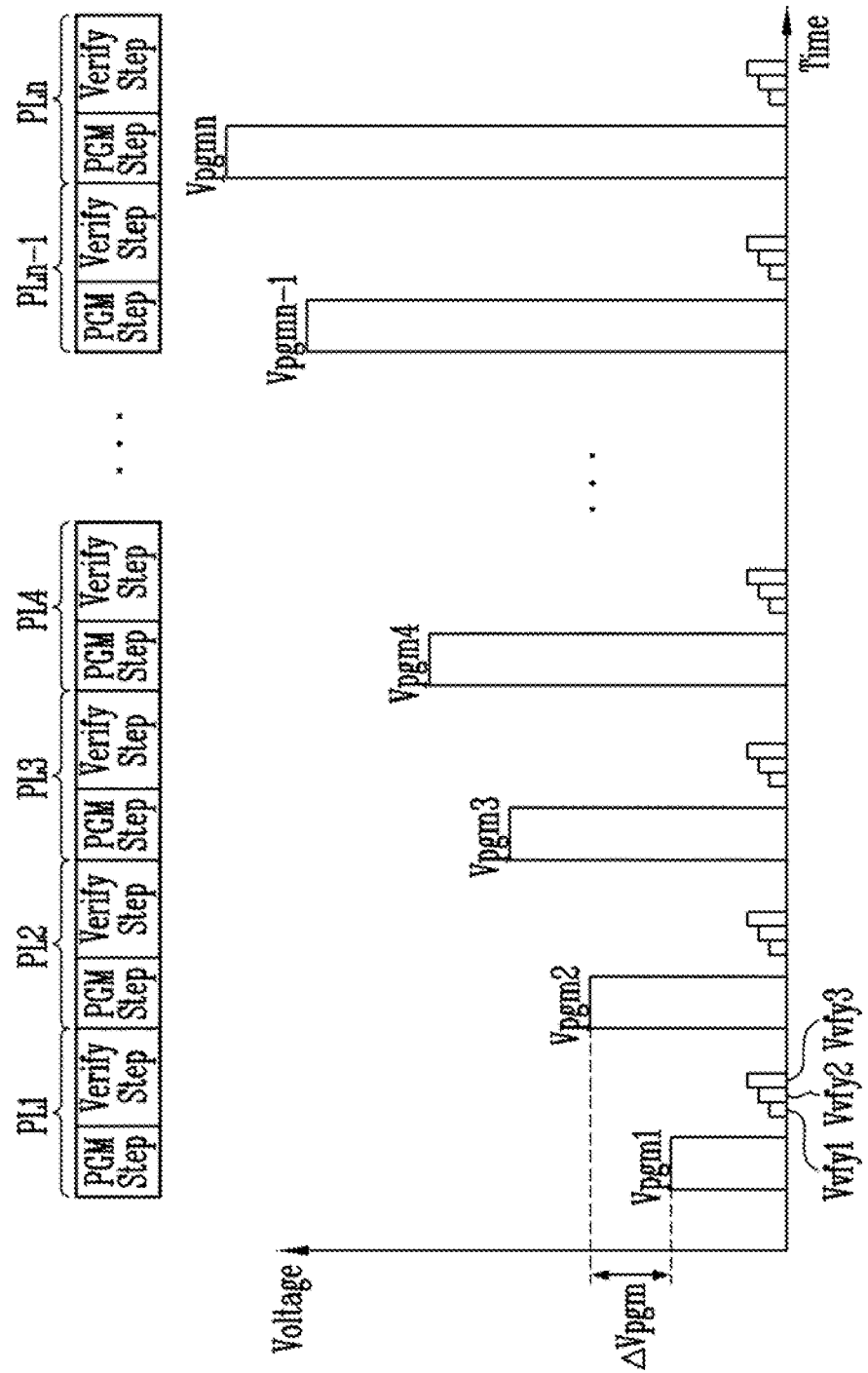
FIG. 8 is a diagram illustrating a program operation of a memory device.

FIG. 8 is a diagram illustrating a program operation of a memory device.

Hereinafter, for convenience of explanation, it may be assumed that each of the memory cells is a multi-level cell (MLC) storing two-bit data. However, the invention is not limited thereto. Instead, each of the plurality of memory cells may be a triple level cell (TLC) storing three-bit data or a quad level cell (QLC) storing four-bit data.

Referring to FIGS. 7 and 8, an erase state E may correspond to data '11', a first program state PV1 may correspond to data '10', a second program state PV2 may correspond to data '00', and a third program state PV3 may correspond to data '01'. However, the above-described bit ordering is given as an example, and it may be modified.

A program operation of the memory device 100 may include a plurality of program loops PL1 to PLn. In other words, the memory device 100 may perform the plurality of program loops PL1 to PLn to program selected memory cells so that each of the selected memory cells may have one of the plurality of program states PV1, PV2, and PV3.

Each of the program loops PL1 to PLn may include a program voltage applying operation (PGM Step) in which a program voltage is applied and a verify operation (Verify Step) in which verify voltages are applied to determine whether memory cells are programmed.

For example, when the first program loop PL1 is performed, first to third verify voltages Vvfy1 to Vvfy3 may be sequentially applied to verify program states of a plurality of memory cells after a first program pulse Vpgm1 is applied. Memory cells each having the first program state PV1 as a target program state may be verified by the first verify voltage Vvfy1. Memory cells each having the second program state PV2 as a target program state may be verified by the second verify voltage Vvfy2. Memory cells having the third program state PV3 as a target program state may be verified by the third verify voltage Vvfy3.

The memory cells determined as verify pass by the first to third verify voltages Vvfy1 to Vvfy3 may be determined to have the target program states. These memory cells may be program-inhibited in the subsequent second program loop PL2. To program the remaining memory cells, except for the program-inhibited memory cells, in the second program loop PL2, a second program pulse Vpgm2 greater than the first program pulse Vpgm1 by a unit voltage ΔVpgm may be applied thereto. Subsequently, a verify operation may be performed in the same manner as the verify operation of the first program loop PL1. For example, a memory cell may be determined as verify pass when the memory cell is read as an off-cell by a verify voltage.

As exemplified above, when the memory device 100 programs a multi-level cell (MLC) storing 2-bit data, the memory device 100 may verify each of the memory cells having each of the program states as the target program state by using the first to third verify voltages Vvfy1 to Vvfy3.

During a verify operation, a verify voltage may be applied to a selected word line coupled to selected memory cells, and the selected memory cells may be determined as verify pass or not based on a current or a voltage flowing through bit lines coupled to the selected memory cells.

Figure 9:
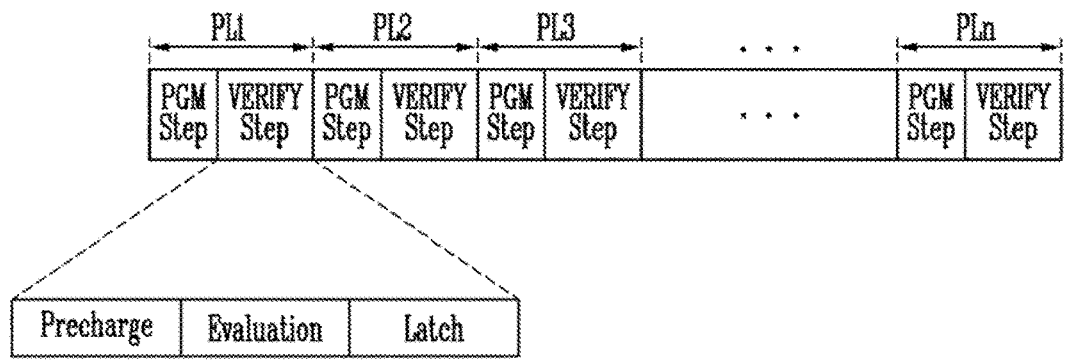
FIG. 9 is a detailed diagram of processes of a verify operation.

FIG. 9 is a detailed diagram illustrating processes of a verify operation.

Referring to FIG. 9, a program operation of the memory device 100 may include the plurality of program loops PL1 to PLn. In other words, the memory device 100 may perform the plurality of program loops PL1 to PLn so that each of the memory cells may have one of the plurality of program states.

Each of the plurality of program loops PL1 to PLn may include a program voltage applying operation (PGM Step) in which a program voltage is applied to a selected word line and a verify operation (Verify Step) in which verify voltages are applied to the selected word line to determine whether the memory cells are programmed.

The verify operation (Verify Step) included in each of the program loops may include a precharge operation, an evaluation operation and a latch operation.

During the precharge operation, a page buffer coupled to a selected memory cell may precharge the bit line BL coupled between the page buffer and the selected memory cell to a bit line voltage corresponding to a target program state of the selected memory cell through a sensing node SO coupled to the bit line BL.

During the evaluation operation, a verify voltage corresponding to a program state to be verified may be applied to a selected word line coupled to the selected memory cell and a voltage of the bit line BL may be changed by a current flowing through the selected memory cell.

During the latch operation, the page buffer 330 may sense the voltage of the bit line BL coupled to the selected memory cell and store the program state of the selected memory cell in a latch. The program state may correspond to a verify pass or a verify fail. When a threshold voltage of the selected memory cell is greater than the verify voltage applied to the selected word line, the selected memory cell may be read as an off-cell as a result of the evaluation operation.

Figure 10:
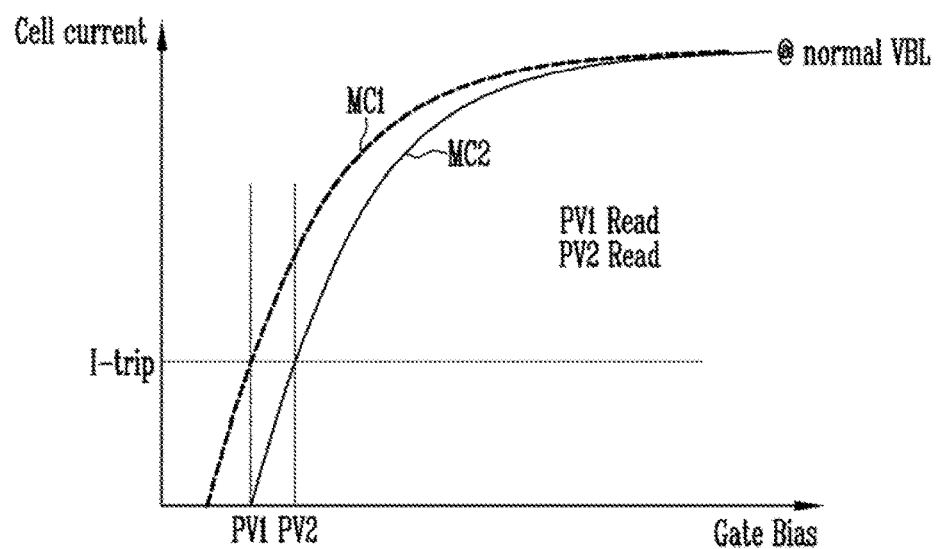
FIG. 10 is a graph illustrating that each of the memory cells having different target program states is verified.

FIG. 10 is a graph illustrating that each of a plurality of memory cells having different target program states is verified.

Referring to FIG. 10, the horizontal axis represents the magnitude of a verify voltage applied to a gate electrode of a memory cell during a verify operation (gate bias), and the vertical axis represents the amount of current flowing through the memory cell.

In FIG. 10, a current-voltage curve of a memory cell having a first program state PV1 as a target program state is indicated by the solid line, and a current-voltage curve of a memory cell having a second program state PV2 as a target program state is indicated by the dotted line. As an example, the memory cell having the first program state PV1 as the target program state is defined as a first memory cell MC1, and the memory cell having the first program state PV1 as the target program state is defined as a second memory cell MC2.

During a verify operation, a reference bit line voltage (Normal VBL) may be applied to bit lines coupled to the first memory cell MC1 and the second memory cell MC2.

A cell current flowing through a memory cell may increase when a verify voltage applied to a gate increases. The current flowing through a memory cell may increase to a level varying depending on a program state of the memory cell.

For example, when a verify voltage is applied to a word line, when a cell current flowing through a memory cell exceeds a critical value I-trip, the memory cell may be read as an off-cell. When the cell current flowing through the memory cell is below the critical value I-trip, the memory cell may be read as an on-cell. The memory cell read as the off-cell may correspond to verify pass and the memory cell read as the on-cell may correspond to verify fail.

When the first verify voltage Vvfy1 is applied to a word line to verify the first program state, a cell current of the first memory cell MC1 may have a current value exceeding the critical value I-trip according to a program state. However, a cell current of the second memory cell MC2 may not have a current value exceeding the critical value I-trip when the first verify voltage Vvfy1 is applied.

Therefore, in order to verify the program states of the first memory cell MC1 and the second memory cell MC2, a read operation may be performed twice respectively using the first verify voltage Vvfy1 and the second verify voltage Vvfy2. When the number of program states to verify increases, the number of read operations required to be performed also increases and thus time required to perform the overall program operations may increase.

Figures 11, 12:
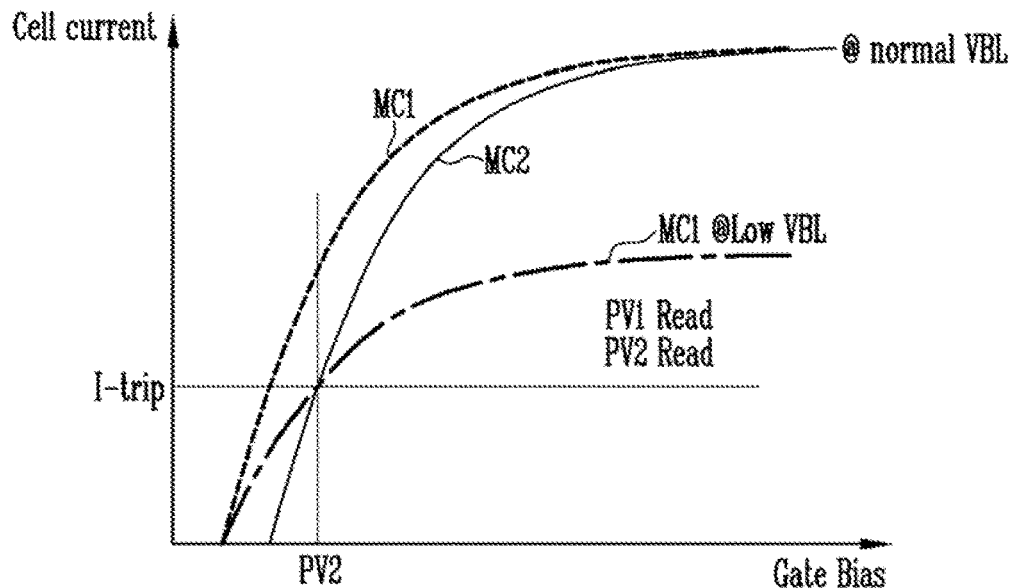
FIG. 11 is a graph illustrating the principle of a verify operation according to an embodiment.
FIG. 12 is a diagram illustrating a voltage applied to a word line and a voltage applied to a bit line during a verify operation according to an embodiment.

FIG. 11 is a graph illustrating the principle of a verify operation according to an embodiment.

Referring to FIG. 11, the horizontal axis represents the magnitude of a verify voltage applied to a gate electrode of a memory cell in a verify step, and the vertical axis represents the amount of current flowing through the memory cell.

In the graph of FIG. 11, a current-voltage curve of a memory cell having the first program state PV1 as a target program state is indicated by the dotted line, and a current-voltage curve of a memory cell having the second program state PV2 as a target program state is indicated by the solid line. For convenience of explanation, the memory cell having the first program state PV1 as the target program state may be defined as the first memory cell MC1, and the memory cell having the second program state PV2 as the target program state may be defined as the second memory cell MC2.

According to an embodiment of the invention, when a bit line voltage (Low VBL) lower than a reference bit line voltage (Normal VBL) is applied to a bit line coupled to the first memory cell MC1, a voltage-current graph of the first memory cell MC1 may be indicated by alternate long and short dash line.

When the second verify voltage Vvfy2 is applied to a word line to verify the second program state PV2, a current difference may occur due to difference between the bit line voltages Low VBL and Normal VBL applied to the bit lines coupled to the first memory cell MC1 and the second memory cell MC2, respectively. Therefore, the cell current flowing through each of the first memory cell MC1 and the second memory cell MC2 may exceed the critical value I-trip.

According to the above-described principle, the memory cells MC1 and MC2 having the program states PV1 and PV2 different from each other as the target program states may be verified by a single verify operation.

For example, the second verify voltage Vvfy2 to verify the program state PV2 having a greater threshold voltage than the program state PV1 may be applied to the word line. In addition, the bit line voltage Low VBL of the first memory cell MC1 for a lower threshold voltage as a target program state may be lower than the bit line voltage Normal VBL of the first memory cell MC1 for a higher threshold voltage than a target program state, as illustrated in FIG. 11. As a result, the memory cells MC1 and MC2 having the program states PV1 and PV2 as the target program states may be verified by a single verify operation.

FIG. 12 is a diagram illustrating a voltage applied to a word line and a voltage applied to a bit line during a verify operation according to an embodiment.

Referring to FIG. 12, a memory device may verify at least two program states by a single verify operation.

More specifically, when the second verify voltage Vvfy2 corresponding to the second program state PV2 is applied to a word line, the memory device may verify the first program state PV1 and the second program state PV2 at the same time.

For example, when the second verify voltage Vvfy2 is applied to a word line coupled to first and second memory cells respectively having first and second program states PV1 and PV2 as target program states (assuming PV1<PV2), a reference bit line voltage VBLnormal may be applied to a bit line coupled to the second memory cell, and a bit line voltage lower than the reference bit line voltage VBLnormal by ΔV (unit voltage) may be applied to a bit line coupled to the first memory cell.

According to an embodiment, when the third verify voltage Vvfy3 corresponding to the third program state PV3 is applied to a word line, the memory device may verify the first to third program states PV1 to PV3 at the same time.

For example, when the third verify voltage Vvfy3 is applied to the word line coupled to first to third memory cells respectively having first to third program states PV1 to PV3 as target program states (assuming PV1<PV2<PV3), the reference bit line voltage VBLnormal may be applied to a bit line coupled to the third memory cell, a bit line voltage lower than the reference bit line voltage VBLnormal by ΔV (unit voltage) may be applied to the bit line coupled to the second memory cell, and a bit line voltage lower than the reference bit line voltage VBLnormal by 2ΔV (two times greater than a unit voltage) may be applied to the bit line coupled to the first memory cell.

According to an embodiment, when the fourth verify voltage Vvfy4 corresponding to the fourth program state PV4 is applied to a word line, the memory device may verify the first to fourth program states PV1 to PV4 at the same time.

For example, when the fourth verify voltage Vvfy4 is applied to a word line coupled to first to fourth memory cells respectively having first to fourth program states PV1 to PV4 as target program states (assuming PV1<PV2<PV3<PV4), the reference bit line voltage VBLnormal may be applied to a bit line coupled to the fourth memory cell, a bit line voltage lower than the reference bit line voltage VBLnormal by ΔV (unit voltage) may be applied to a bit line coupled to the third memory cell, a bit line voltage lower than the reference bit line voltage VBLnormal by 2ΔV (two times greater than a unit voltage) may be applied to a bit line coupled to the second memory cell, and a bit line voltage lower than the reference bit line voltage VBLnormal by 3ΔV (three times greater than the unit voltage) may be applied to a bit line coupled to the first memory cell.

Figure 13:
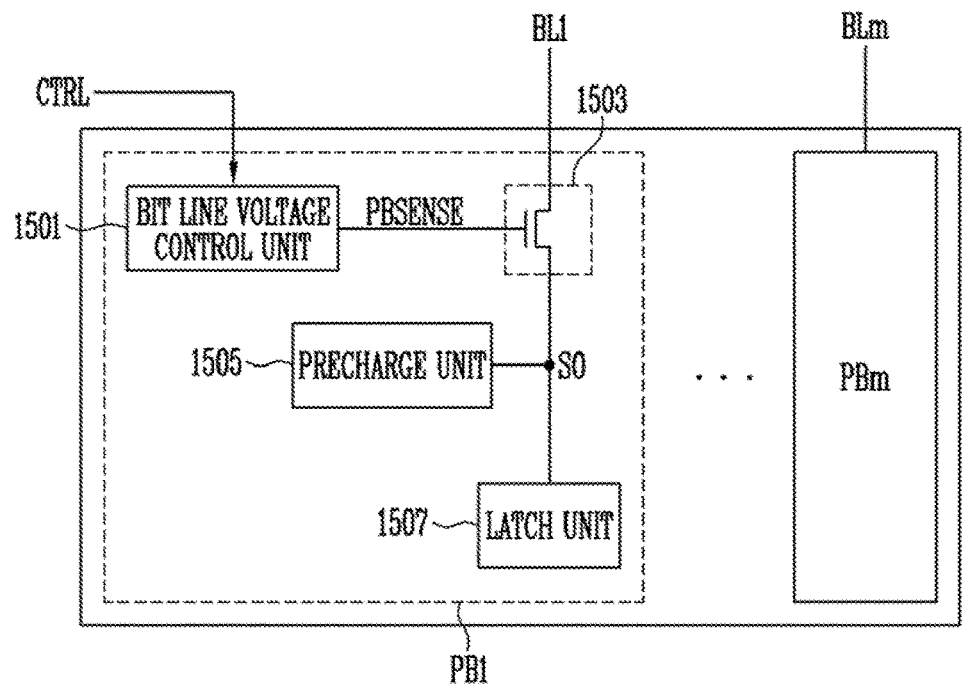
FIG. 13 is a diagram illustrating an exemplary operation of a page buffer setting a bit line voltage during a verify operation.

FIG. 13 is a diagram illustrating an exemplary operation of a page buffer setting a bit line voltage during a verify operation.

Referring to FIG. 13, the read and write circuit 123 may include the first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to a control signal CTRL of the verify operation control unit 140 described with reference to FIG. 1 or 2.

The structure of the first page buffer PB1 coupled to the first bit line BL1 will be described with reference to FIG. 13. The second to mth page buffers PB2 to PBm may be understood as having a similar structure to the first page buffer PB1.

The first page buffer PB1 may include a bit line voltage control unit 1501, a voltage transfer unit 1503, a precharge unit 1505 and a latch unit 1507.

The bit line voltage control unit 1501 may provide a transfer signal PBSENSE to the voltage transfer unit 1503 in response to the control signal CTRL. The bit line voltage control unit 1501 may provide the transfer signal PBSENSE having a voltage level varying depending on a difference in threshold voltage between a program state corresponding to a verify voltage applied to a word line coupled to a memory cell and a target program state of the memory cell coupled to the first bit line BL1.

The voltage transfer unit 1503 may include an NMOS transistor coupled between the first bit line BL1 and the sensing node SO and have a gate to which the transfer signal PBSENSE is input. The voltage transfer unit 1503 may electrically couple the first bit line BL1 and the sensing node SO in response to the transfer signal PBSENSE. A voltage level of a bit line voltage applied to the first bit line BL1 may vary depending on a voltage level of the transfer signal PBSENSE applied to the voltage transfer unit 1503.

The precharge unit 1505 may precharge the sensing node SO to a power voltage VDD during a precharge period.

The latch unit 1507 may sense a voltage or current in the first bit line BL1 through the sensing node SO and store a state of the memory cell as an off-cell or an on-cell in the latch unit 1507 when the first bit line BL1 and the sensing node SO are electrically connected to each other.

Processes of a verify operation will be described below with reference to FIGS. 9, 12, and 13.

The first page buffer PB1 may precharge the sensing node SO to the power voltage VDD during the precharge period. The voltage transfer unit 1503 may electrically couple the sensing node SO to the bit line BL in response to the transfer signal PBSENSE, so that the first bit line BL1 may be precharged. A voltage level to which the first bit line BL1 is precharged may vary depending on a voltage level of the transfer signal PBSENSE applied to the voltage transfer unit 1503 during the precharge period.

According to an embodiment of the invention, the bit line voltage control unit 1501 may determine the voltage level of the transfer signal PBSENSE applied to the voltage transfer unit 1503 according to the control signal CTRL output from the verify operation control unit 140 described with reference to FIG. 2. The voltage level of the voltage applied to the first bit line BL1 during the precharge period may vary depending on the determined voltage level of the transfer signal PBSENSE. More specifically, when the program state corresponding to the verify voltage applied to the word line coupled to a selected memory cell is the same as the target program state of the selected memory cell coupled to the first bit line BL1, the bit line voltage control unit 1501 may output the transfer signal PBSENSE for applying the reference bit line voltage VBLnormal to the first bit line BL1. Alternatively, when the target program state of the selected memory cell coupled to the first bit line BL1 is lower than the program state corresponding to the verify voltage applied to the word line, the bit line voltage control unit 1501 may output the transfer signal PBSENSE for applying a lower bit line voltage than the reference bit line voltage VBLnormal.

The voltage applied to the bit line according to the difference in threshold voltage between the program state corresponding to the verify voltage applied to the word line and the target program state of the memory cell coupled to the first bit line BL1 may be determined by the bit line voltages described with reference to FIG. 12.

Figure 14:
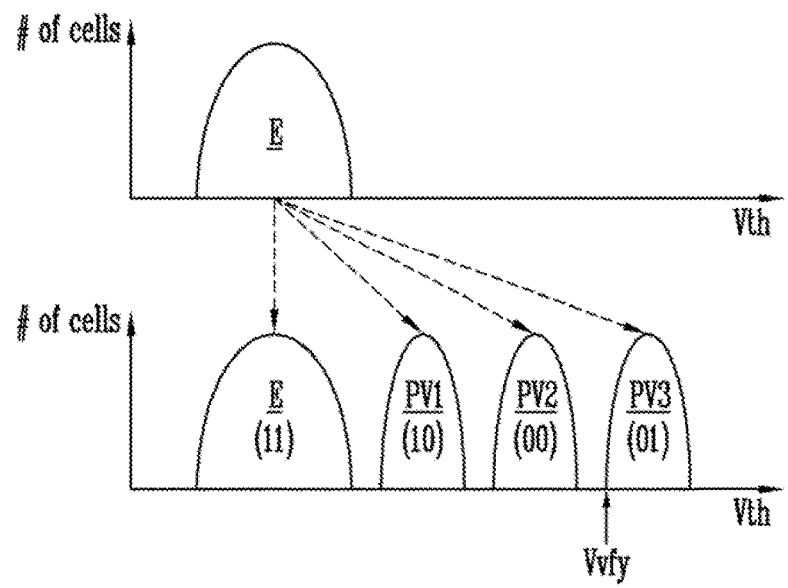
FIG. 14 is a diagram illustrating a threshold voltage distribution of memory cells formed by a program operation including a verify operation according to an embodiment.

FIG. 14 is a diagram illustrating a threshold voltage distribution of memory cells formed by a program operation including a verify operation according to an embodiment.

Figure 15:
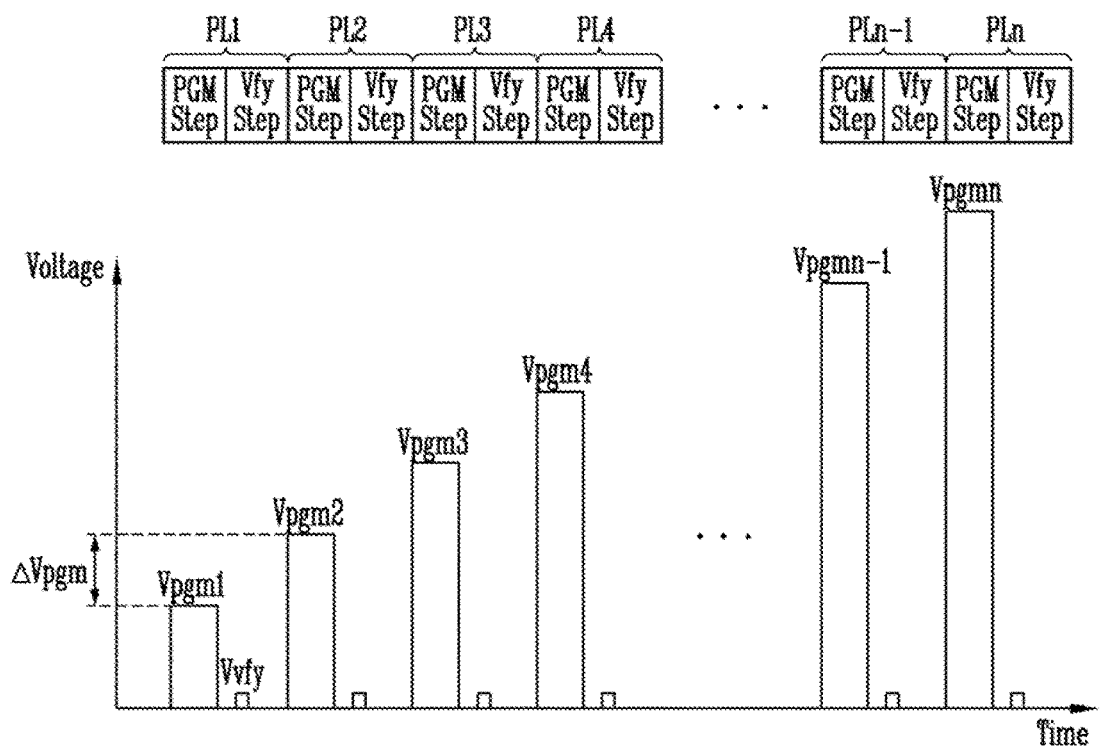
FIG. 15 is a diagram illustrating a program operation according to an embodiment.

FIG. 15 is a diagram illustrating a program operation according to an embodiment.

Referring to FIGS. 14 and 15, each of the memory cells may be programmed to have at least one of an erase state E and first to third program states PV1 to PV3. Contrary to FIGS. 7 and 8, in accordance with an embodiment of the present invention, the memory device 100 may verify program states of a plurality of memory cells by using a single verify voltage Vvfy.

A program operation of the memory device 100 may include the plurality of program loops PL1 to PLn. In other words, the memory device 100 may perform the plurality of program loops PL1 to PLn so that each of the selected memory cells may have one of the plurality of program states PV1, PV2, and PV3.

Each of the plurality of program loops PL1 to PLn may include a program voltage applying operation (PGM Step) in which a program voltage is applied and a verify operation (Verify Step) in which verify voltages are applied so as to determine whether memory cells are programmed.

When the first program loop PL1 is performed, a verify operation may be performed by the single verify voltage Vvfy to verify the program states of the plurality of memory cells after the first program pulse Vpgm1 is applied unlike the existing art shown in FIG. 8. For example, each of the plurality of memory cells may have one of the erase state E and the first to third program states PV1 to PV3 as a target program state. The memory cells each having the first, second, or third program state PV1, PV2, or PV3 as the target program state may be verified by the verify voltage Vvfy.

The bit line voltages may be provided to bit lines coupled to the plurality of memory cells during a verify operation as described with reference to FIG. 12. More specifically, the reference bit line voltage VBLnormal may be applied to a bit line coupled to the third memory cell having the third program state PV3 as a target program state, the bit line voltage lower than the reference bit line voltage VBLnormal by ΔV (unit voltage) may be applied to a bit line coupled to the second memory cell having the second program state PV2 as the target program state, and the bit line voltage lower than the reference bit line voltage VBLnormal by 2ΔV (two times greater than a unit voltage) may be applied to a bit line coupled to the first memory cell having the first program state PV1 as a target program state.

Each of the memory cells determined as verify pass during the verify operation may be determined as having the target program state, and may be program-inhibited in the second program loop PL2. To program the remaining memory cells, except for the program-inhibited memory cells, in the second program loop PL2, the second program pulse Vpgm2 higher than the first program pulse Vpgm1 by the unit voltage ΔVpgm may be applied. Subsequently, a verify operation may be performed in the same manner as the verify operation of the first program loop PL1. For example, verify pass may indicate that a memory cell is read as an off-cell by a corresponding verify voltage.

As described above, when the memory device 100 programs a multi-level cell (MLC) storing 2-bit data, the memory device 100 may apply the single verify voltage Vvfy to the word line coupled to memory cells, and apply different bit line voltages to bit lines coupled to the memory cells according to target program states of the memory cells, so that the memory cells may be verified at the same time.

Figure 16:
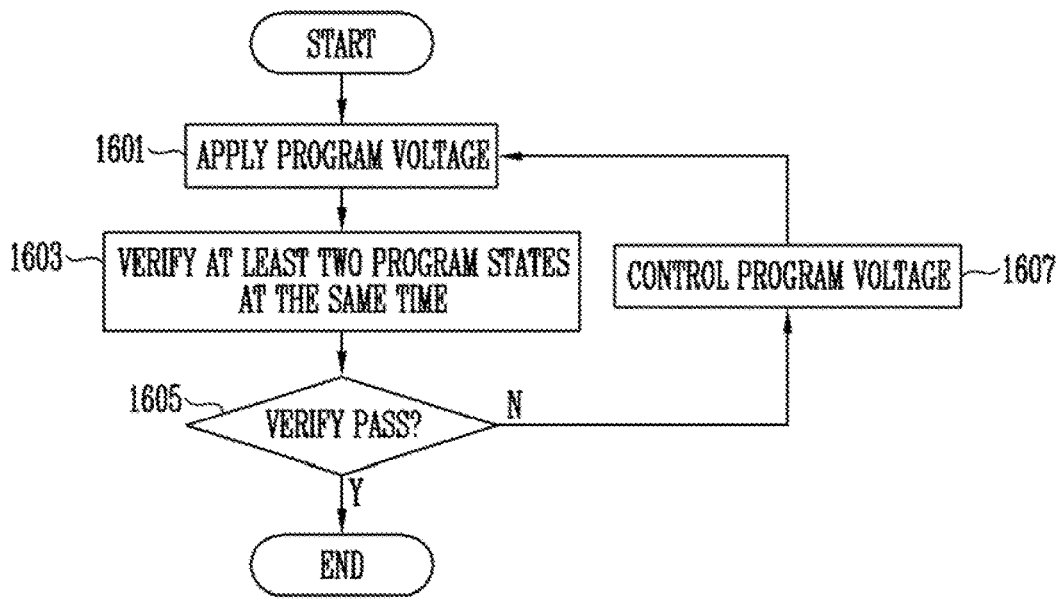
FIG. 16 is a flowchart illustrating an exemplary operation of a memory device according to an embodiment.

FIG. 16 is a flowchart illustrating an exemplary operation of a memory device according to an embodiment of the invention.

Referring to FIG. 16, at step 1601, a memory device may apply a program voltage to a selected word line. Threshold voltages of selected memory cells coupled to the selected word line may increase when the program voltage is applied.

At step 1603, the memory device may verify at least two program states of the selected memory cells at the same time. A method of performing the verify operation will be described in more detail with reference to FIG. 17.

At step 1605, the memory device may determine verify pass or verify fail of the selected memory cells, terminate the program operation to the selected memory cells when is the respective selected memory cells are determined as verify pass, and proceed to step 1607 when the respective selected memory cells are determined as verify fail.

At step 1607, the memory device may increase a level of the program voltage for the selected memory cells determined as verify fail and proceed to step 1601 to apply the increased program voltage.

Figure 17:
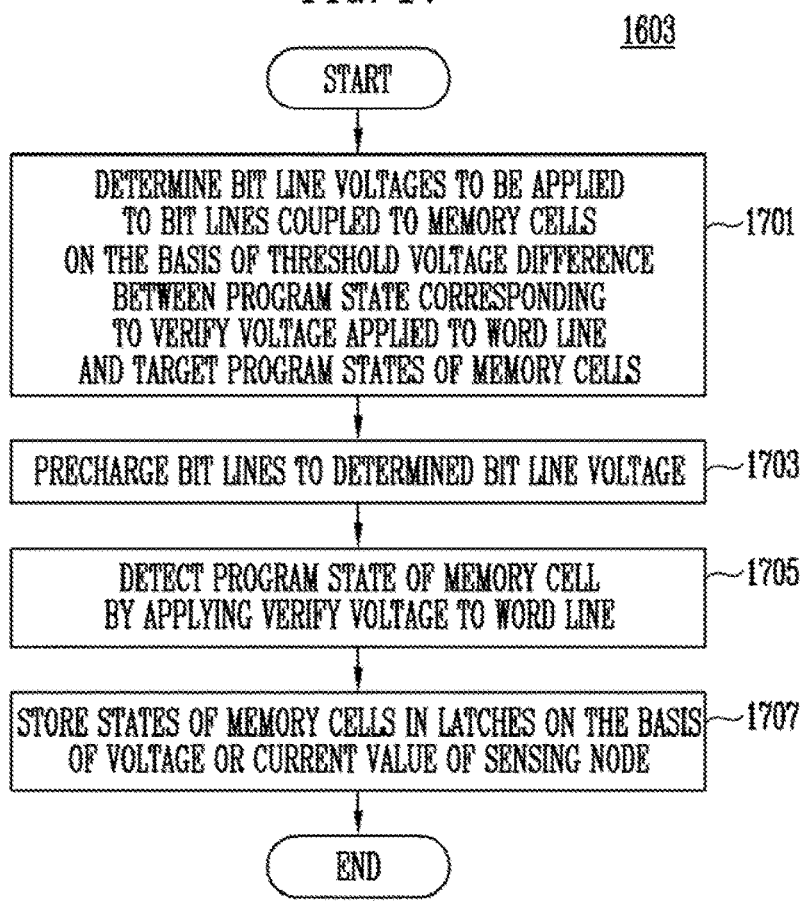
FIG. 17 is a flowchart illustrating a verify operation (step 1603) of FIG. 16.

FIG. 17 is a flowchart illustrating the verify operation of step 1603 of FIG. 16.

Referring to FIG. 17, the memory device may determine bit line voltages applied to bit lines coupled to the selected memory cells according to a difference in threshold voltage between a program state corresponding to a verify voltage applied to the selected word line and target program states of the selected memory cells at step 1701.

At step 1703, the memory device may precharge the bit lines to the determined bit line voltages.

At step 1705, the memory device may apply a verify voltage to the selected word line and detect program states of the selected memory cells through the bit lines. A cell current flowing through the bit lines may change voltage or current values of sensing nodes included in page buffers coupled to the bit lines according to the program states of the selected memory cells.

At step 1707, the memory device may store the program states of the selected memory cells on the basis of the voltage or current values of the sensing nodes in latches of the page buffers.

Figure 18:
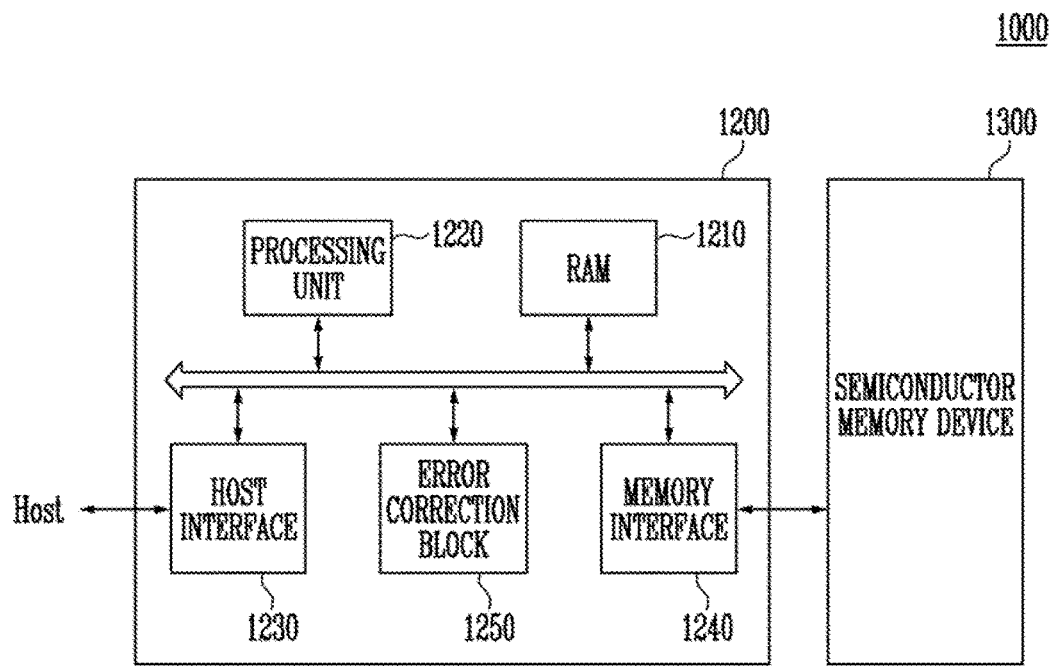
FIG. 18 is a block diagram illustrating another embodiment of a storage device shown in FIG. 1.

FIG. 18 is a block diagram illustrating another embodiment (1000) of a storage device shown in FIG. 1.

Referring to FIG. 18, the storage device 1000 may include a semiconductor memory device 1300 and a controller 1200.

The semiconductor memory device 1300 may be configured and operated in substantially the same manner as the semiconductor memory device 100 described above with reference to FIG. 1. Thus, a detailed description thereof will be omitted.

The controller 1200 may be coupled to a host and the semiconductor memory device 1300. The controller 1200 may access the semiconductor memory device 1300 at the request of the host. For example, the controller 1200 may control a read operation, a program operation, an erase operation, and/or a background operation of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processing unit 1220, a host interface 1230, a memory interface 1240 and an error correction block 1250.

The RAM 1210 may be used as an operation memory of the processing unit 1220, a cache memory between the semiconductor memory device 1300 and the host, and/or a buffer memory between the semiconductor memory device 1300 and the host.

The processing unit 1220 may control operations of the controller 1200. The processing unit may be configured to control a read operation, a program operation, an erase operation and background operations of the semiconductor memory device 1000. The processing unit 1220 may be configured to operate firmware to control the semiconductor memory device 1000. According to an embodiment, the processing unit 1220 may function as a flash translation layer FTL. The processing unit 1220 may translate a logical block address LBA provided by the host into a physical block address PBA through the flash translation layer FTL. The flash translation layer FTL may receive the logical block address LBA by using a mapping table and translate the logical block address LBA into the physical block address PBA. There may be various address mapping methods for the flash translation layer according to a mapping unit. Examples of these address mapping methods may include a page mapping method, a block mapping method, and a hybrid mapping method.

The processing unit 1220 may be configured to randomize data received from the host. For example, the processing unit 1220 may randomize the data received from the host by using a randomizing seed. The randomized data may be provided to the semiconductor memory device 1300, so that the memory cell array may be programmed with the randomized data.

The processing unit 1220 may be configured to derandomize the data from the semiconductor memory device 1300 during a read operation. For example, the processing unit 1220 may derandomize the data received from the semiconductor memory device 1000 by using a derandomizing seed. The derandomized data may be output to the host.

According to an embodiment, the processing unit 1220 may perform randomizing and derandomizing operations by driving software or firmware.

The host interface 1230 may include a protocol for data exchange between the host and the controller 1200. According to an embodiment, the controller 1200 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 1300. For example, the memory interface 1240 may include a NAND flash interface or a NOR flash interface.

The error correction code circuit 1250 may detect and correct an error in data received from the semiconductor memory device 1300 by using an error correction code (ECC). In addition, the error correction code circuit 1250 may correct an error in the read page data by using the error correction code (ECC). The error correction code circuit 1250 may correct an error by using coded modulation, such as low density parity check (LDPC) code, Bose-Chaudhuri-Hocquenghem code (BCH) code, turbo code, Reed-Solomon code, convolution code, recursive systematic code (RSC), trellis-coded modulation (TCM), block coded modulation (BCM), and hamming code.

The controller 1200 and the semiconductor memory device 1300 may be integrated in one semiconductor device. According to an embodiment, the controller 1200 and the semiconductor memory device 1300 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1200 and the semiconductor memory device 1300 may be integrated in a single semiconductor device to form a solid state drive (SSD). The SSD may include a storage device for storing data in a semiconductor memory device. When the storage device 1000 is used as an SSD, operational rates of the host coupled to the storage device 1000 may be significantly improved.

In another example, the storage device 1000 may be used as one of several elements in various electronic devices such as a computer, an ultra-mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 1300 or the storage device 1000 may be packaged in various forms. For example, the semiconductor memory device 1300 or the storage device 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), etc.

Figure 19:
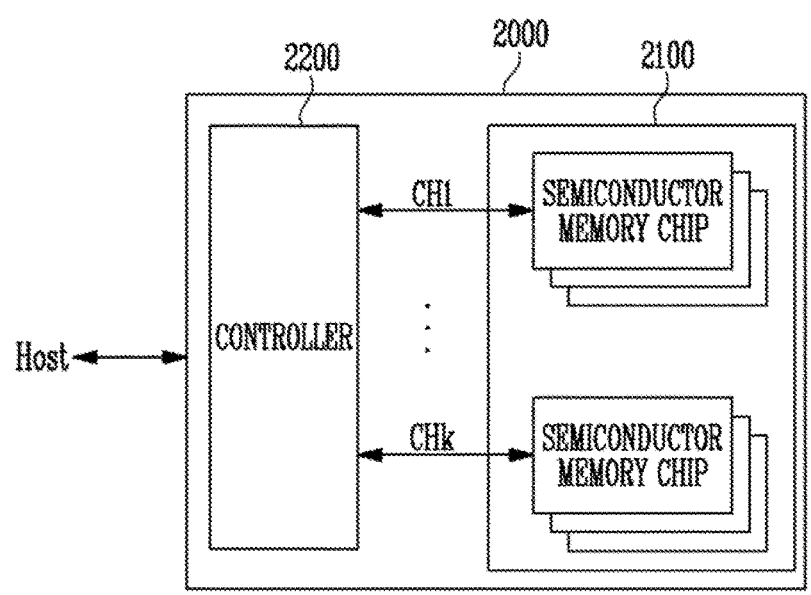
FIG. 19 is a block diagram illustrating an application example of a storage device shown in FIG. 18.

FIG. 19 is a block diagram illustrating an application example (2000) of the storage device 1000 shown in FIG. 18.

Referring to FIG. 19, a storage device 2000 may include a semiconductor memory device 2100 and a controller 2200. The semiconductor memory device 2100 may include semiconductor memory chips. The semiconductor memory chips may be divided into groups.

FIG. 19 illustrates the groups communicating with the controller 2200 through first to k-th channels CH1 to CHk. Each of the semiconductor memory chips may be configured and operated in substantially the same manner as the semiconductor memory device 100 described above with reference to FIG. 1 or 2.

Each group may communicate with the controller 2200 through a single common channel. The controller 2200 may be configured in substantially the same manner as the controller 1200 described with reference to FIG. 10, and configured to control the plurality of memory chips of the semiconductor memory device 2100.

As illustrated in FIG. 19, a plurality of semiconductor memory chips may be coupled to a single channel. However, the storage device 2000 may be modified so that a single semiconductor memory chip may be coupled to a single channel.

Figure 20:
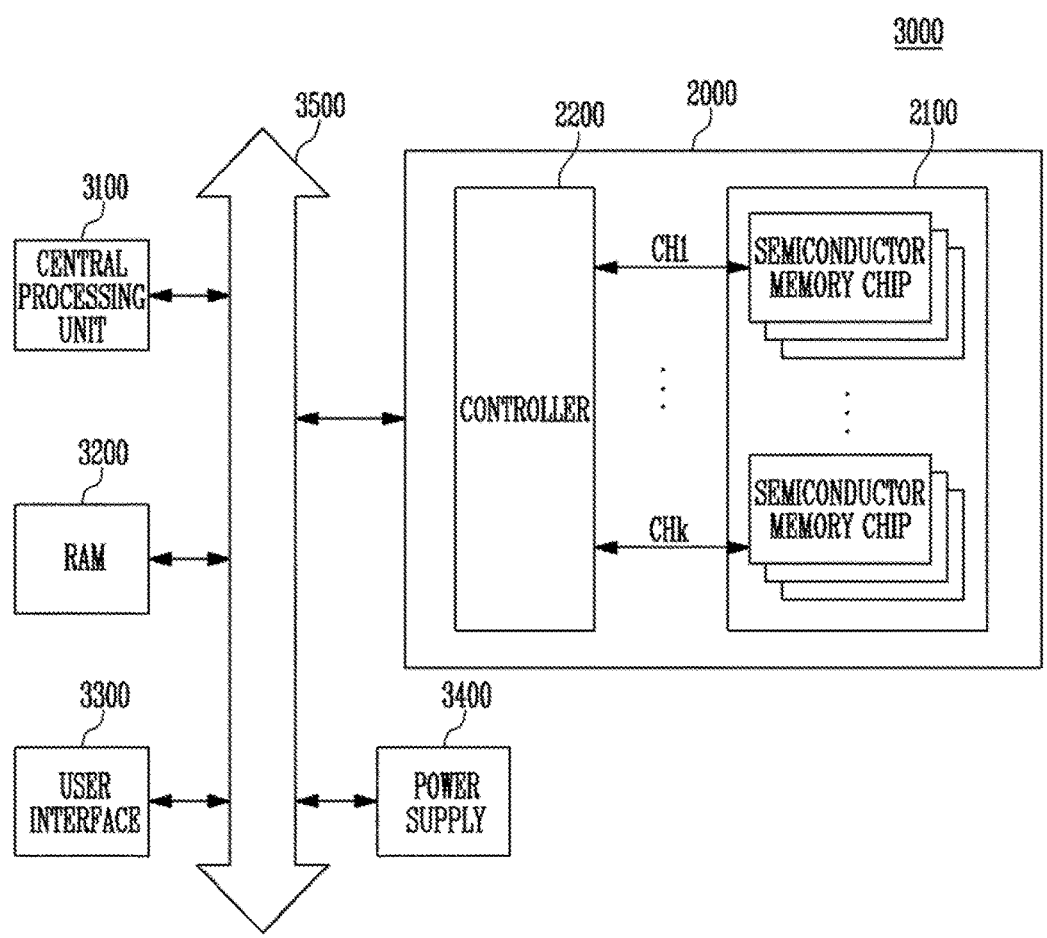
FIG. 20 is a block diagram illustrating a computing system including a storage device described with reference to FIG. 19.

FIG. 20 is a block diagram illustrating a computing system 3000 having the storage device 2000 described above with reference to FIG. 19.

Referring to FIG. 20, the computing system 3000 may include a central processing unit 3100, a random access memory (RAM) 3200, a user interface 3300, a power supply 3400, a system bus 3500, and a storage device 2000.

The storage device 2000 may be electrically connected to the central processing unit 3100, the RAM 3200, the user interface 3300 and the power supply 3400 through the system bus 3500. Data provided through the user interface 3300 or processed by the central processing unit 3100 may be stored in the storage device 2000.

In FIG. 20, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 20, the storage device 2000 shown in FIG. 19 may be provided as the memory system 3000. However, the storage device 2000 may be replaced by the storage device 1000 shown in FIG. 18. According to an embodiment, the computing system 3000 may include both of the memory systems 1000 and 2000 described above with reference to FIGS. 18 and 19.

According to embodiments of the invention, a memory device having an improved program speed and an operating method thereof may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory device, comprising:
  a plurality of memory cells connected to a word line, each of the plurality of memory cells being programmed to one of a plurality of program states;
  a peripheral circuit configured to perform a program operation to the plurality of memory cells, the program operation including a program voltage applying operation and a verify operation; and
  a control logic configured to control the peripheral circuit to simultaneously perform the verify operation for at least two program states by applying bit line voltages having different voltage levels to bit lines coupled to the plurality of memory cells,
  wherein the control logic controls the peripheral circuit to apply the bit line voltages determined based on a difference between a voltage applied to the word line and threshold voltages corresponding to target program states of the plurality of memory cells.

2. The memory device of claim 1, wherein the control logic includes a verify operation control unit determining the bit line voltages to be applied to the bit lines on the basis of the target program states of the plurality of memory cells and a program state corresponding to a verify voltage applied to the word line coupled to the plurality of memory cells during the verify operation.

3. The memory device of claim 2, wherein the verify operation control unit controls the peripheral circuit to apply a reference bit line voltage to a corresponding bit line when the target program state of a corresponding memory cell is the same as the program state corresponding to the verify voltage applied to the word line.

4. The memory device of claim 3, wherein the verify operation control unit controls the peripheral circuit to apply a lower voltage than the reference bit line voltage to a corresponding bit line when a threshold voltage of the target program state of a corresponding memory cell is less than a threshold voltage of the program state corresponding to the verify voltage applied to the word line.

5. The memory device of claim 1,
  further comprising page buffer circuits coupled to the plurality of memory cells through the bit lines,
  wherein each of the page buffer circuits comprises:
  a bit line voltage control unit configured to determine the bit line voltages to be applied during the verify operation;
  a voltage transfer unit configured to transfer the bit line voltages to the bit lines;
  a precharge unit configured to precharge sensing nodes coupled to the bit lines to a power voltage; and
  a latch unit configured to store verify pass or verify fail of the memory cells on the basis of voltage or current values of the sensing nodes varying depending on the program states of the memory cells.

6. The memory device of claim 1,
  wherein the plurality of program states comprise first to nth program states, where n is a natural number greater than or equal to 2, and
  wherein when a verify voltage corresponding to a kth program state, among the first to nth program states, is applied to the word line during the verify operation, the control logic controls the peripheral circuit to:

apply a reference bit line voltage to a corresponding bit line of a corresponding memory cell having the kth program state as a target program state, where k is a natural number greater than or equal to 2; and apply a bit line voltage having a lower voltage level than the reference bit line voltage by a unit voltage to a corresponding bit line of a corresponding memory cell having a (k−1)th program state as a target program state.

7. The memory device of claim 6, wherein the control logic controls the peripheral circuit to apply a bit line voltage having a lower voltage level than the reference bit line voltage by (k−m) times as much as the unit voltage to a corresponding bit line of a corresponding memory cell having an mth program state, among the first to nth program states, as a target program state during the verify operation, where m is a natural number less than k and greater than or equal to 1.

8. A method of operating a memory device including a plurality of memory cells each being programmed to have one of a plurality of program states, the method comprising:

applying a program voltage to a word line coupled to the plurality of memory cells; and simultaneously verifying at least two program states by applying bit line voltages different from each other to bit lines coupled to the plurality of memory cells, wherein the bit line voltages are determined based on a difference between a verify voltage applied to the word line and threshold voltages corresponding to target program states of the plurality of memory cells.

9. The operating method of claim 8, wherein the verifying of the at least two program states comprises:

determining the bit line voltages to be applied to the bit lines on the basis of a threshold voltage difference between a program state corresponding to the verify voltage to be applied to the word line and the target program states of the plurality of memory cells, respectively;

precharging the bit lines to the bit line voltages; and determining verify pass or verify fail of the plurality of memory cells through the bit lines when the verify voltage is applied to the word line.

10. The operating method of claim 9, wherein in the determining of the bit line voltages, a bit line voltage applied to a corresponding memory cell having a program state corresponding to a lower threshold voltage than the program state corresponding to the verify voltage as a target program state is determined to have a lower voltage level than a bit line voltage applied to a corresponding memory cell having a program state the same as the program state corresponding to the verify voltage as a target program state.

11. The operating method of claim 9, wherein the determining of the verify pass comprises determining a corresponding memory cell as the verify pass when a cell current flowing through the corresponding memory cells is greater than a critical value.

12. The operating method of claim 9, wherein the plurality of program states comprise first to nth program states, where n is a natural number greater than or equal to 2, and wherein the determining of the bit lines voltages comprises, when a verify voltage corresponding to a kth program state, among the first to nth program states, is applied to the word line, where k is a natural number greater than or equal to 2:

determining a reference bit line voltage as the bit line voltage for a corresponding bit line of a corresponding memory cell having the kth program state as a target program state; and determining a bit line voltage having a lower voltage level than the reference bit line voltage by a unit voltage as the bit line voltage for a corresponding bit line of a corresponding memory cell having a (k−1)th program state as a target program state.

13. The operating method of claim 12, wherein the determining of the bit line voltages comprises determining a bit line voltage having a lower voltage level than the reference bit line voltage by (k−m) times as much as the unit voltage as the bit line voltage for a corresponding bit line of a corresponding memory cell having an mth program state, among the first to nth program states, as a target program state.

14. A memory device, comprising:

a plurality of memory cells connected to a selected word line;

a peripheral circuit configured to perform a program voltage applying operation and a program verify operation on the plurality of memory cells; and a control logic configured to control the peripheral circuit to simultaneously perform the program verify operation of applying a verify voltage to the selected word line and applying bit line voltages determined based on a threshold voltage difference between target program states of the selected memory cells and a program state corresponding to the verify voltage to bit lines coupled to the selected memory cells.

15. The memory device of claim 14, wherein the control logic determines a reference bit line voltage as the bit line voltage when the target program state of a corresponding memory cell is the same as the program state corresponding to the verify voltage.

16. The memory device of claim 15, wherein the control logic controls the peripheral circuit to apply a lower voltage than the reference bit line voltage to a corresponding bit line coupled to a corresponding memory cell having a threshold voltage of a target program state lower than a threshold voltage of the program state corresponding to the verify voltage.

* * * * *